(12) United States Patent
Müller et al.

(10) Patent No.: US 9,219,172 B2
(45) Date of Patent: Dec. 22, 2015

(54) OPTOELECTRONIC COMPONENT (75) Inventors: Klaus Müller, Pettendorf (DE); Gudrun Lindberg, Bad Abbach (DE); Richard Baisl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/343,952

(22) PCT Filed: Sep. 11, 2012

(86) PCT No.: PCT/EP2012/067722
§ 371 (c)(1),
(2), (4) Date: May 8, 2014

(87) PCT Pub. No.: WO2013/017764
PCT Pub. Date: Mar. 21, 2013

(65) Prior Publication Data
US 2014/0291658 A1  Oct. 2, 2014

(30) Foreign Application Priority Data
Sep. 14, 2011  (DE) .......................... 10 2011 113 428

(51) Int. Cl.
| H01L 51/52 | (2006.01) |
| H01L 31/0203 | (2014.01) |
| H01L 33/56 | (2010.01) |
| H01L 51/44 | (2006.01) |
| H01L 33/44 | (2010.01) |

(52) U.S. Cl.
CPC ............ *H01L 31/0203* (2013.01); *H01L 33/44* (2013.01); *H01L 33/56* (2013.01); *H01L 51/448* (2013.01); *H01L 51/5253* (2013.01); *H01L 2224/48091* (2013.01)

(58) Field of Classification Search
None
See application file for complete search history.

(56) References Cited

U.S. PATENT DOCUMENTS

| 4,962,985 | A | 10/1990 | LeGrange |
| 5,888,850 | A | 3/1999 | Havens |
| 2003/0080049 | A1* | 5/2003 | Lee et al. ........................ 210/483 |
| 2004/0108811 | A1 | 6/2004 | Klausmann et al. |
| 2007/0135007 | A1* | 6/2007 | McCarthy et al. ............ 442/123 |
| 2010/0068490 | A1* | 3/2010 | Shih et al. ..................... 428/220 |
| 2010/0176417 | A1 | 7/2010 | Wang |
| 2010/0181906 | A1* | 7/2010 | Kuma et al. ................... 313/504 |
| 2010/0227157 | A1 | 9/2010 | Heuft et al. |

(Continued)

FOREIGN PATENT DOCUMENTS

| DE | 102005032545 | 1/2007 |
| DE | 102008019900 | 8/2009 |

(Continued)

OTHER PUBLICATIONS

Ogawa K. et al., "Applications of a Chemically Adsorbed Monomolecular Layer Having a Fluorocarbon Chain as an Anti-Contamination Film," *Jpn. J. Appl. Phys.*, vol. 39, 2000, pp. 6684-6689.

(Continued)

*Primary Examiner* — Khaja Ahmad
(74) *Attorney, Agent, or Firm* — DLA Piper LLP (US)

(57) ABSTRACT

An optoelectronic component having an outer surface facing the environment of the optoelectronic component and which is formed by a hydrophobic layer applied at least partly on a surface of the optoelectronic component.

17 Claims, 5 Drawing Sheets

(56) References Cited

U.S. PATENT DOCUMENTS

| | | | | |
|---|---|---|---|---|
| 2010/0272945 | A1* | 10/2010 | Nam et al. | 428/76 |
| 2010/0330715 | A1 | 12/2010 | Gopal | |
| 2011/0006335 | A1* | 1/2011 | Lee | 257/99 |
| 2011/0278621 | A1 | 11/2011 | Taeger et al. | |
| 2013/0193470 | A1 | 8/2013 | Bernd et al. | |

FOREIGN PATENT DOCUMENTS

| | | |
|---|---|---|
| DE | 102008031405 | 1/2010 |
| DE | 102008048472 | 3/2010 |
| DE | 10 2008 057 350 | 5/2010 |
| DE | 102009024411 | 9/2011 |
| DE | 10 2010 033 963 | 2/2012 |
| EP | 2 287 941 | 2/2011 |

OTHER PUBLICATIONS

Schnitzer I. et al., "30% external quantum efficiency from surface textured, thin-film light-emitting diodes," *Appl. Phys. Letter*, vol. 63, 1993, pp. 2174-2176.

Parkin I. P., "Self-cleaning coatings," *Journal of Materials Chemistry.*, vol. 15, 2005, pp. 1689-1695.

\* cited by examiner

OPTOELECTRONIC COMPONENT

TECHNICAL FIELD

This disclosure relates to an optoelectronic component.

BACKGROUND

Optoelectronic components and in particular those which comprise an organic functional material such as organic light-emitting diodes (OLEDs), for example, can be extremely sensitive to effects of the surrounding atmosphere, for example, to moisture and oxygen. For protection therefrom, therefore, for a long operating life it is necessary to hermetically seal organic optoelectronic components.

By way of example, it is known to encapsulate organic optoelectronic components with a glass cover, for example, in the form of a glass substrate having a cavity, by adhesively bonding the glass cover with an adhesive layer on the substrate of the component. Usually, a non-transparent liquid-absorbing substance (getter) composed of zeolite is also adhesively bonded into the cavity to bind moisture or oxygen which can penetrate through the adhesive as described, for example, in US 2004/0108811 A1.

Furthermore, thin-film encapsulations comprising thin films which seal an organic optoelectronic component with respect to moisture and oxygen are known. Compared to encapsulation with a glass cover, thin-film encapsulation is more readily industrializable and is therefore given preference for further development. Examples of thin-film encapsulations are described in DE 102008031405, DE 102008048472, DE 102008019900 and DE 102009024411.

Inorganic optoelectronic components, for example, inorganic light-emitting diodes (LEDs), also have a certain sensitivity and an ageing behavior caused by moisture. Therefore, such components are usually encapsulated in a plastic, for example, with a silicone potting. Furthermore, it is also possible to protect inorganic optoelectronic components against harmful substances by a thin-film encapsulation mentioned above.

It has been found, however, that thin-film encapsulations often do not have the moisture stability and impermeability necessary for a high long-term stability of optoelectronic components. It could therefore be helpful to provide such an optoelectronic component.

SUMMARY

We provide an optoelectronic component having an outer surface facing the environment of the optoelectronic component and which is formed by a hydrophobic layer applied at least partly on a surface of the optoelectronic component.

We further provide an optoelectronic component having an outer surface facing the environment of the optoelectronic component and which is formed by a hydrophobic layer applied at least partly on a surface of the optoelectronic component, wherein the hydrophobic layer is covalently bonded to the surface of the optoelectronic component.

Lastly, we provide an optoelectronic component having an outer surface facing the environment of the optoelectronic component and which is formed by a hydrophobic layer applied at least partly on a surface of the optoelectronic component, wherein the hydrophobic functional groups comprise fluorinated hydrocarbons.

DETAILED DESCRIPTION

Our optoelectronic components may have an outer surface facing the environment of the optoelectronic component. In other words, this means that the outer surface of the optoelectronic component has direct contact with the surrounding atmosphere. This also means that gases and/or liquids, that is to say, for example, oxygen, hydrogen sulphide and/or moisture from the surrounding atmosphere can act directly on the outer surface.

The outer surface facing the environment of the optoelectronic component may be formed by a hydrophobic layer applied at least partly on a surface of the optoelectronic component. The hydrophobic layer is thus exposed directly to the surrounding atmosphere and is not covered by further layers such as, for example, encapsulation layers or an encapsulation arrangement.

The hydrophobic properties of the hydrophobic layer make it possible to reduce the surface energy of the outer surface formed by the hydrophobic layer compared to an uncovered surface of the optoelectronic component. This reduces the contact angle in particular with polar liquids or substances, for example, moisture as a result of which the contact area, for example, between water droplets and the outer surface decreases. As a consequence thereof it is possible, for example, to reduce the intake of water on the surface of the optoelectronic component. Furthermore, the adhesion capability of polar substances such as moisture, for example, on the outer surface is also reduced. As a result, it possible to achieve a self-cleaning effect for the outer surface and an anticontamination effect or an antiwetting effect for the outer surface, which is also referred to as the so-called "lotus effect," for example.

Particularly preferably, the hydrophobic layer covers at least all surfaces of the optoelectronic component which are sensitive to the surrounding atmosphere or which are at least partly permeable to moisture and/or gases of the surrounding atmosphere, such that the surfaces form hydrophobic outer surfaces of the optoelectronic component on account of the hydrophobic layer.

The hydrophobic layer can comprise, in particular, hydrophobic groups which form the hydrophobic outer surface. Hydrophobic groups can contain in each case at least one perfluorinated carbon, for example. The hydrophobic groups can be contained in a chain-type molecule. By way of example, the material of the hydrophobic layer can comprise substituted or unsubstituted hydrocarbon chains having a $CF_3$ group at one end thereof.

The material of the hydrophobic layer can furthermore contain silane groups, which can be functionalized. The silane groups can be present at the end of a molecular chain, for example, a hydrocarbon chain at which the $CF_3$ group is not present. A functionalized silane group can form a covalent bond with the surface of the optoelectronic component and thus fix the hydrophobic layer on the surface of the optoelectronic component. If no silane group is present, fixing the hydrophobic layer on the optoelectronic component can also arise by hydrogen bridge bonds or van der Waals interactions.

The material of the hydrophobic layer can be at least partly PTFE-like, for example, that is to say that it contains fluorocarbons similar to polytetrafluoroethylene (PTFE) and which can contain $CF_2$ and $CF_3$ groups, whereby the hydrophobic property is brought about.

The hydrophobic groups can be present at the outer surface of the hydrophobic layer facing away from the surface of the optoelectronic component and can form at least part of the outer surface of the optoelectronic component. As a result, the hydrophobic layer can be in particular non-wettable and can act repellent with respect to other materials.

The hydrophobic layer may have a thickness of greater than or equal to 1 nm and less than or equal to 10 nm. The hydrophobic layer can be present in one or a plurality of molecular monolayers.

The hydrophobic layer may comprise a monomolecular layer comprising hydrophobic functional groups facing away from the surface of the component and facing toward the environment.

The hydrophobic layer may comprise a fluorinated organochlorosilane. Such materials comprise a chlorine-substituted silane group to which a fluorinated alkyl radical is attached. By way of example, the hydrophobic layer can be formed by applying one or a plurality of the following materials or a combination thereof to the surface: $CF_3(CF_2)_7(CH_2)_2SiCl_3$ (heptadecyldecafluorodecyltrichlorosilane, $CF_3(CF_2)_7(CH_2)_2Si(CH_3)_2(CH)_{10}SiCl_2$ ((heptadecyldecafluorodecyldimethylsilyl)-decyl-trichlorosilane), $CF_3(CF_2)_5(CH_2)_2SiCl_3$.

The hydrophobic layer may comprise a self assembled monolayer (SAM) or may be formed by such. A self assembled layer comprising, for example, one of the fluorinated organochlorosilanes mentioned can be bonded with hydroxy groups on the surface of the optoelectronic component by a dehydrochlorination reaction, for example. Furthermore, it is also possible, for example, to expose the optoelectronic component to a mixture of a chlorosilane dissolved in hexamethylsiloxane to form a hydrophobic layer on the surface of the component. Furthermore, the hydrophobic layer can also comprise a plurality of self assembled monolayers one above another.

The hydrophobic layer may comprise a superhydrophobic material. Here and hereinafter, superhydrophobic denotes, in particular, such materials which have a contact angle with water of greater than or equal to 160°.

The optoelectronic component may have one or a plurality of semiconductor layer sequences having an active region which can emit light and/or detect light during operation. The semiconductor layer sequence can be based on an inorganic and/or an organic semiconductor material.

Particularly preferably, the hydrophobic layer is transparent such that light can be emitted or light can be received via the hydrophobic outer surface.

The semiconductor layer sequence may be an inorganic semiconductor layer sequence. The inorganic semiconductor layer sequence can be an inorganic semiconductor chip, for example, which is a light-emitting or light-detecting semiconductor chip and has an active region which can emit or detect light during operation of the optoelectronic component. The semiconductor layer sequence can be produced on the basis of different semiconductor material systems depending on the wavelength. For long-wave, infrared to red radiation, for example, a semiconductor layer sequence on the basis of $In_xGa_yAl_{1-x-y}As$ is suitable; for red to yellow radiation, for example, a semiconductor layer sequence on the basis of $In_xGa_yAl_{1-x-y}P$ is suitable, and for short-wave visible light, in particular in the range of green to blue light, and/or for UV radiation, for example, a semiconductor layer sequence on the basis of $In_xGa_yAl_{1-x-y}N$ is suitable, where in each case $0 \leq x \leq 1$ and $0 \leq y \leq 1$ hold true.

The inorganic semiconductor layer sequence can be grown on a growth substrate by an epitaxy method, for example, metal organic vapor phase epitaxy (MOVPE) or molecular beam epitaxy (MBE), and be provided with electrical contacts.

Furthermore, the semiconductor layer sequence can be transferred to a carrier substrate and the growth substrate can be thinned or completely removed. Such semiconductor chips which have as substrate a carrier substrate instead of the growth substrate can also be designated as so-called "thin-film semiconductor chips."

A thin-film semiconductor chip is distinguished, in particular, by the following characteristic features:

a reflective layer is applied or formed at a first main area of a semiconductor layer sequence facing toward the carrier substrate, the reflective layer reflecting at least part of the electromagnetic radiation generated in the semiconductor layer sequence back into the latter;

the semiconductor layer sequence has a thickness of 20 μm or less, in particular 4 μm to 10 μm; and the semiconductor layer sequence contains at least one semiconductor layer having at least one area having an intermixing structure which ideally leads to an approximately ergodic distribution of the light in the epitaxial semiconductor layer sequence, that is to say that it has an as far as possible ergodically stochastic scattering behavior.

A thin-film semiconductor chip is, to a good approximation, a Lambertian surface emitter. The basic principle of a thin-film light-emitting diode chip is described, for example, in I. Schnitzer et al., Appl. Phys. Lett. 63 (16), Oct. 18, 1993, 2174-2176.

Further features and examples concerning inorganic semiconductor layer sequences and inorganic semiconductor chips are known and therefore will not be explained any further here.

The semiconductor layer sequence may be an organic semiconductor layer sequence. In particular, the organic semiconductor layer sequence can be in this case an organic radiation-emitting diode (OLED) or an organic photodiode (OPD). For this purpose, the organic semiconductor layer sequence can have an active region that emits or detects electromagnetic radiation during operation of the optoelectronic component. The organic semiconductor layer sequence can comprise, in particular, on a substrate between a first and a second electrode, at least one of which is transparent, a plurality of functional layers composed of organic materials, for example, electron transport layers, electroluminescent layers and/or hole transport layers.

By way of example, the substrate can comprise glass, quartz, plastic films, metal, metal films, silicon wafers or some other suitable substrate material. If the organic semiconductor layer sequence is an OLED and in this case furthermore a so-called "bottom emitter", that is to say that the radiation generated in the active region is emitted through the substrate, then the substrate is in particular also transparent. If the electrode facing away from the substrate is transparent, then the organic semiconductor layer sequence is a so-called "top emitter".

At least one of the first and second electrodes can, for example, comprise a transparent conductive oxide or be composed thereof. Transparent conductive oxides ("TCO" for short) are transparent conductive materials, generally metal oxides such as, for example, zinc oxide, tin oxide, cadmium oxide, titanium oxide, indium oxide or indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

Furthermore, at least one of the first and second electrodes can, for example, comprise a metal or be composed thereof, for instance aluminum, barium, indium, silver, gold, magnesium, calcium or lithium and compounds, combinations and alloys thereof.

The organic functional layers of the semiconductor layer sequence can comprise organic polymers, organic oligomers, organic monomers, organic small, non-polymeric molecules, ("small molecules") or combinations thereof. In particular, it can be advantageous if the organic semiconductor layer sequence has a functional layer embodied as a hole transport layer to enable effective injection of holes into an electroluminescent layer or an electroluminescent region. By way of example, tertiary amines, carbozol derivatives, conductive polyaniline or polyethylene dioxythiophene may prove to be advantageous as materials for a hole transport layer. Furthermore, it can be advantageous if at least one functional layer is an electroluminescent layer. Suitable materials for this purpose include materials which have radiation emission on account of fluorescence or phosphorescence, for example, polyfluorene, polythiophene or polyphenylene or derivatives, compounds, mixtures or copolymers thereof. Depending on the materials in the functional layers, the first radiation generated can have individual wavelengths or ranges or combinations thereof from the ultraviolet to red spectral range.

Further features and examples concerning organic semiconductor layer sequences and in particular concerning OLEDs or OPVs are known and will not be explained any further here.

The materials used in inorganic and organic semiconductor layer sequences, for example, for the functional layers and/or electrode layers, can have a high sensitivity to harmful substances such as for instance, moisture, oxygen and/or hydrogen sulphide.

The surface covered at least partly with the hydrophobic layer may be formed by a layer of the semiconductor layer sequence. In particular, the semiconductor layer sequence in this case can be an inorganic semiconductor layer sequence or an inorganic semiconductor chip. By virtue of the fact that the hydrophobic layer is applied as an outer layer directly on the semiconductor layer sequence, wetting of the semiconductor layer sequence of the semiconductor chip by harmful substances from the environment, for example, moisture, oxygen or hydrogen sulphide, can be significantly reduced. Particularly preferably, the inorganic semiconductor layer sequence or the semiconductor chip is covered with the hydrophobic layer on all surfaces facing the environment. By way of example, the semiconductor layer sequence can be arranged on a carrier and covered with the hydrophobic layer on all surfaces facing away from the carrier. It may be possible as a result for the semiconductor layer sequence and thus the optoelectronic component to be exposed directly to the surrounding atmosphere on account of the hydrophobic outer layer and operated without a further encapsulation arrangement.

The optoelectronic component can have an encapsulation arrangement on the semiconductor layer sequence to protect the latter. The encapsulation arrangement can have at least one or a plurality of barrier layers comprising in each case one or a plurality of materials selected from an oxide, a nitride and an oxynitride. In particular, the encapsulation arrangement can be thin-film encapsulation.

An encapsulation arrangement embodied as thin-film encapsulation means a device that forms a barrier with respect to atmospheric substances, in particular with respect to moisture and oxygen, or else with respect to further harmful substances such as, for instance, corrosive gases, for example, hydrogen sulphide. In other words, the thin-film encapsulation is formed such that at most very small proportions of atmospheric substances can penetrate through it. This barrier effect is produced in the encapsulation arrangement substantially by barrier layers and/or passivation layers embodied as thin films and which are part of the encapsulation arrangement. The layers of the encapsulation arrangement generally have a thickness of less than or equal to a few hundred nm.

The encapsulation arrangement may comprise or consist of thin films responsible for the barrier effect of the encapsulation arrangement. The thin films can be applied, for example, by an atomic layer deposition (ALD) method. This denotes a method in which a first gaseous starting compound is fed to a volume in which a surface to be coated is provided such that the first gaseous compound can adsorb on the surface. After the surface has been preferably completely or almost completely covered with the first starting compound, that portion of the first starting compound still present in gaseous form and/or in a form not adsorbed on the surface is generally removed again from the volume and a second starting compound is fed in. The second starting compound is provided to chemically react with the first starting compound adsorbed at the surface, to form a solid ALD layer. It should be pointed out that more than two starting compounds can also be used during the atomic layer deposition.

Suitable materials for the layers of the encapsulation arrangement are, for example, aluminum oxide, zinc oxide, zirconium oxide, titanium oxide, hafnium oxide and lanthanum oxide.

Preferably, the encapsulation arrangement has a layer sequence having a plurality of thin films each having a thickness of one atomic layer to 10 nm.

As an alternative or in addition to thin films produced by ALD, the encapsulation arrangement can have at least one or a plurality of further layers, that is to say in particular barrier layers and/or passivation layers deposited by thermal vapor deposition or by a plasma-enhanced process, for instance sputtering or plasma-enhanced chemical vapor deposition (PECVD). Suitable materials therefor can be the abovementioned materials and silicon nitride, silicon oxide, silicon oxynitride, indium tin oxide, indium zinc oxide, aluminum-doped zinc oxide, aluminum oxide and mixtures and alloys of the materials mentioned. The one or the plurality of further layers has/have, for example, in each case a thickness of 1 nm to 5 μm. Particularly preferably, the one or the plurality of further layers has/have a thickness of 1 nm to 400 nm.

As a result of the construction of the encapsulation arrangement from a plurality of layers produced by ALD or one of the further methods, lattice defects and defects arising during production of the individual layers and can form diffusion channels for moisture and/or further harmful substances can be at least partly sealed by overlying layers.

The surface covered at least partly with the hydrophobic layer may be formed by a surface of an encapsulation arrangement. The encapsulation arrangement can cover the semiconductor layer sequence on all surfaces apart from a side facing a carrier and can thus act together with the carrier as a barrier against harmful substances. The encapsulation arrangement can be covered with the hydrophobic layer, for example, over the whole area. By virtue of the fact that the hydrophobic outer layer is additionally arranged on the encapsulation arrangement, wetting of the encapsulation arrangement, for example, with moisture from the environment is significantly reduced compared to a component which does not have a hydrophobic outer layer. For the case where the encapsulation arrangement has defects, the probability that harmful substances such as moisture, for instance, might penetrate into the encapsulation arrangement through the defects and lead to the failure of the optoelectronic component can be minimized since the contact area for the moisture on the hydrophobic layer is significantly smaller compared to an uncovered surface. The probability of failure for the optoelectronic component can thereby be reduced. The hydrophobic layer can thus increase an additional protection of the optoelectronic component against harmful substances, without the hydrophobic layer itself having to be a layer that is as hermetically impermeable as possible, like the layers of the encapsulation arrangement.

The semiconductor layer sequence may be arranged on a carrier. The carrier can be, for example, a substrate, a printed circuit board, a ceramic carrier, a plastic carrier or a printed circuit board. Furthermore, the carrier can be, for example, a plastic housing having a lead frame on which the semiconductor layer sequence is applied. One or a plurality of electrical contact regions provided to contact the semiconductor layer sequence can be present on the carrier.

Furthermore, the semiconductor layer sequence can be arranged on a carrier having at least one electrical contact region via which the semiconductor layer sequence is electrically connected. The electrical contact region which, for example, comprises or is composed of a metal layer, for example, comprising or composed of silver can be covered at least partly with the hydrophobic layer. The metal layer forming the electrical contact region can thereby be protected against harmful substances in the case of silver, for example, primarily against the influence of corrosive gases such as hydrogen sulphide, for instance. Ageing effects, in this case for the electrical contact region, can thereby be reduced as a result of which a longer lifetime of the component can be attained.

The optoelectronic component may have a cover arranged above the semiconductor layer sequence and the hydrophobic layer and may have a cavity open to the environment of the optoelectronic component. The cover can be formed by a glass cover or a plastic cover, for example, having a depression in which the semiconductor layer sequence is arranged and which is open toward the environment by an opening or a channel. The cover can thereby afford a certain protection for the semiconductor layer sequence, in particular mechanical protection, without a specific sealed microclimate being present within the cavity of the cover. Such covers provided with a ventilation slot are provided in automotive applications, for example.

Moisture and corrosive gases which can penetrate into the cavity of the cover through the channel or the opening can wet the surface covered by the hydrophobic layer only to a small extent or cannot wet it at all, and so damage can be prevented in such a semihermetically closed package.

Further advantages will become apparent from the examples described below in conjunction with the figures.

In the examples and figures, elements that are identical, of identical type or act identically may be provided in each case with the same reference signs. The illustrated elements and their size relationships among one another should not be regarded as true to scale; rather, individual elements such as, for example, layers, structural parts, components and regions may be illustrated with an exaggerated size to enable better illustration and/or to afford a better understanding.

Figure 1:
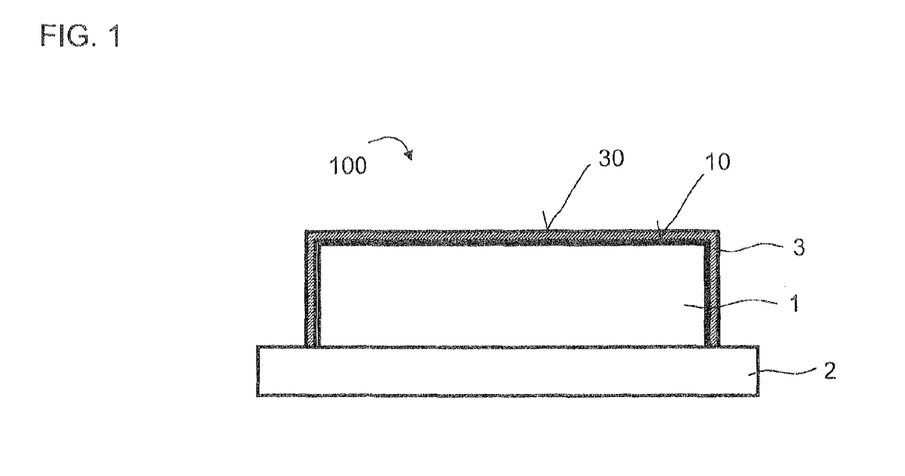
FIG. 1 shows a schematic illustration of an optoelectronic component in accordance with one example.

FIG. 1 shows an optoelectronic component 100 in accordance with one example. The optoelectronic component 100 has an outer surface 30 facing the environment of the optoelectronic component 100 and formed by a hydrophobic layer 3 applied at least partly on a surface 10 of the optoelectronic component 100.

The surface 10 of the optoelectronic component is formed by a semiconductor layer sequence 1. In particular, in the example shown, the semiconductor layer sequence 1 is an inorganic semiconductor layer sequence, and in this case in particular an inorganic semiconductor chip. For this purpose, the semiconductor layer sequence 1 is an epitaxially grown semiconductor layer sequence based on a compound semiconductor material system, for example, a nitridic, a phosphidic or an arsenidic compound semiconductor material system, as described above. The semiconductor layer sequence 1 has at least one active layer or active region suitable and designed to emit or detect electromagnetic radiation, in particular ultraviolet to infrared light, during operation. Furthermore, the semiconductor layer sequence 1 has electrical contact layers by which electrical contact can be made with the semiconductor layer sequence. The individual layers and their functions and their construction are known and are, therefore, not shown here, for the sake of clarity.

The semiconductor layer sequence 1 is arranged on a carrier 2. The carrier 2 can be formed, for example, by a carrier substrate for the semiconductor layer sequence 1 or else, for example, by a ceramic carrier, a plastic carrier, a printed circuit board, a circuit board or a plastic film having conductor tracks or a lead frame.

To protect the semiconductor layer sequence 1 against moisture, in particular, the entire surface 10 facing away from the carrier 2, that is to say the top side facing away from the carrier 2 and also the side areas of the semiconductor layer sequence 1, is covered with the hydrophobic layer 3. Consequently, in the example shown, in the case of the optoelectronic component 100, all outer surfaces apart from that of the carrier 2 are formed by the hydrophobic layer 3.

The hydrophobic layer 3 comprises hydrophobic groups comprising at least partly perfluorinated carbon atoms. In particular, the material of the hydrophobic layer is, for example, in a PTFE-like fashion and contains PTFE-like fluorocarbons. As a result of the hydrophobic properties of the hydrophobic layer 3 at the outer surface 30 of the optoelectronic component 100, the surface energy of the outer surface 30 is reduced compared to the surface 10 of the semiconductor layer sequence 1. As a result, wettability of the outer surface 30 is significantly lower than that of the surface 10 such that the contact area, for example, between moisture and the outer surface 30 is considerably minimized compared to a contact area between moisture and the surface 10 of the semiconductor layer sequence 1. The probability of moisture wetting the surface 10 and thereby possibly damaging the semiconductor layer sequence 1 is considerably reduced as a result. Furthermore, the adhesion capability of polar substances on the outer surface 30 is also reduced as a result of which it is possible to attain a self-cleaning effect for the outer surface.

The optoelectronic component 100 and in particular the semiconductor layer sequence 1 can thereby be operated under atmospheric conditions without a further encapsulation or protection arrangement since wetting with hydrophilic substances such as, for instance, air humidity or corrosive gases can be prevented or at least greatly reduced by the hydrophobic layer 3 and the surface tension—altered thereby—of the outer surfaces 30 compared to the surfaces 10 of the semiconductor layer sequence 1. The hydrophobic layer 3 has, in particular, such a small thickness and a high transparency associated therewith such that the light generated in the semiconductor layer sequence 1 during operation can be emitted via the hydrophobic outer surface 30.

In addition to the example shown with the hydrophobic layer 3 only on surfaces 10 of the semiconductor layer sequence 1, the hydrophobic layer 3 can also be applied at least partly or wholly on the carrier 2 such that surfaces of the carrier 2 also have a hydrophobic outer surface and thus low wettability.

Figure 2A:
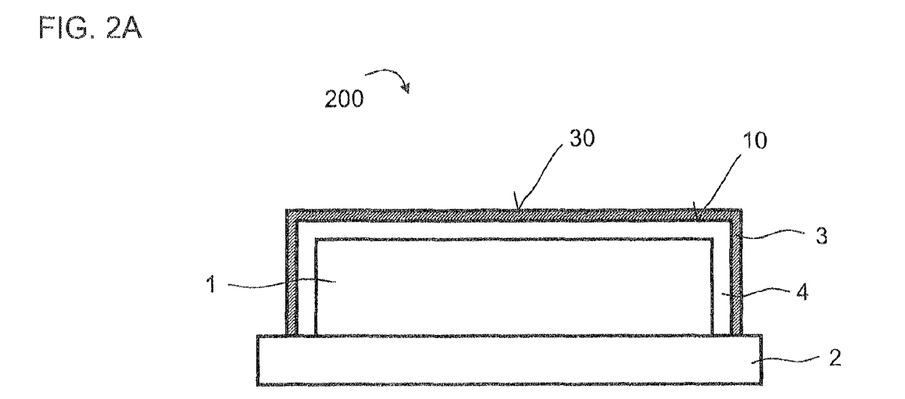
FIGS. 2A to 2C show schematic illustrations of an optoelectronic component in accordance with a further example.
Figure 2B:
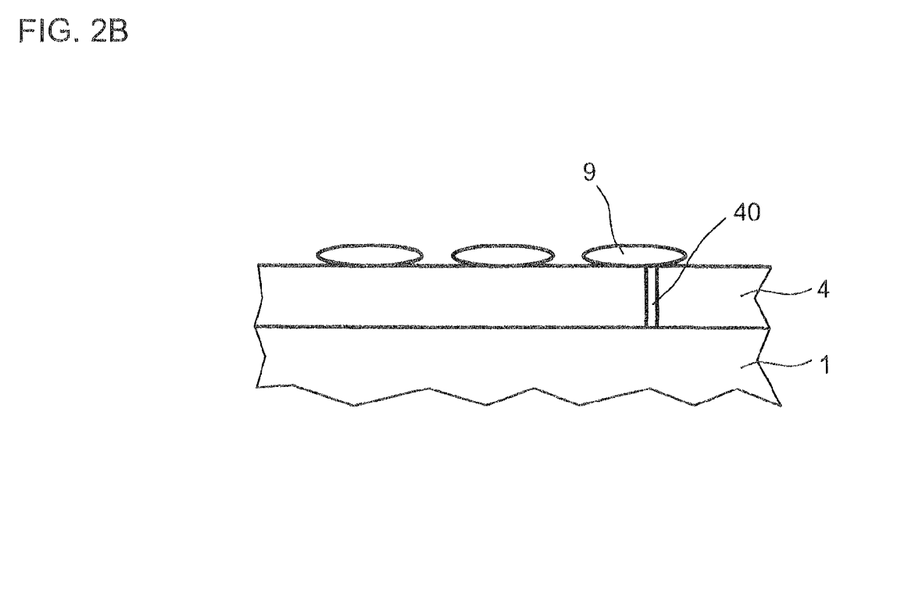
Figure 2C:
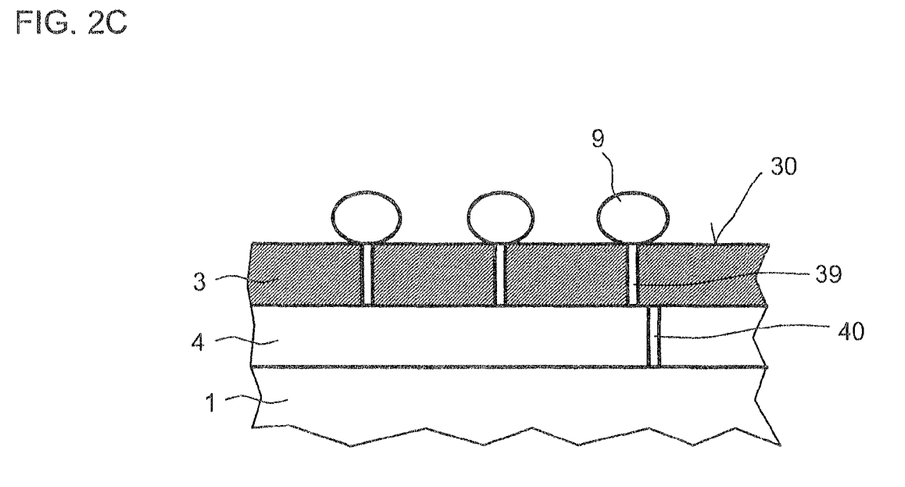

FIGS. 2A to 2C show an optoelectronic component 200 in accordance with a further example. In this case, as is shown in FIG. 2A, the optoelectronic component 200 has an organic semiconductor layer sequence which, for example, as described above, is an organic light-emitting diode (OLED) or an organic photodiode (OPD). For this purpose, the semiconductor layer sequence 1 has functional organic layers in particular, for example, in the case of an OLED an electroluminescent layer and hole transport layers and/or electron transport layers, between two electrodes. In this case, the optoelectronic component 200 can be either a bottom emitter, in which light is emitted through the carrier 2 embodied as a carrier substrate, or as a top emitter, in which light is emitted in the direction facing away from the carrier 2.

An encapsulation arrangement 4 is arranged above the semiconductor layer sequence 1, the encapsulation arrangement being a thin-film encapsulation and having a plurality of barrier layers. The barrier layers are applied as thin films by an atomic layer deposition method (ALD) and comprise, for example, aluminum oxide, zinc oxide, zirconium oxide, titanium oxide, hafnium oxide, lanthanum oxide or a combination thereof. Each of the thin films of the encapsulation arrangement 4 has a thickness of just a few tens of nanometers, and so the encapsulation arrangement 4 is transparent.

Although highly impermeable encapsulation arrangements can be produced by atomic layer deposition, it may nevertheless be possible that the encapsulation arrangement has defects which can form channels for moisture or corrosive gases penetrating from outside. FIG. 2B shows purely by way of example an excerpt from a semiconductor layer sequence 1 with encapsulation arrangement 4 arranged thereon, which encapsulation arrangement has a defect 40 embodied as a channel. Through this channel 40, which is also designated as a so-called "pinhole," it may be possible that moisture can penetrate from outside as far as the semiconductor layer sequence 1. If, as shown purely by way of example in FIG. 2B, only the encapsulation arrangement 4 is present, having a high surface energy and thus high wettability for polar substances such as moisture, for example, then water droplets 9 have a large contact area with respect to the encapsulation arrangement 4. This increases the probability that a water droplet 9 from the air humidity will be taken up in a region of the encapsulation arrangement 4 in which a defect 40 is present.

If the optoelectronic component, as shown in FIG. 2A and as an excerpt in FIG. 2C, has the hydrophobic layer 3 on the encapsulation arrangement 4, then the contact area between the water droplets 9 and the outer surface 30 of the hydrophobic layer 3 decreases considerably compared to the contact area between the water droplets 9 and the surface of the encapsulation arrangement 4 in accordance with FIG. 2B. Even if the hydrophobic layer 3 itself is not hermetically impermeable such that—as shown in FIG. 2C—moisture can possibly penetrate via moisture channels 39 in the hydrophobic layer 3 as far as the encapsulation arrangement 4, the probability of this penetrating moisture reaching a defect 40 of the encapsulation arrangement 4 is nevertheless considerably reduced.

Therefore, although the hydrophobic layer 3 itself is not hermetically impermeable, it can considerably reduce the probability that moisture or corrosive gases can reach the semiconductor layer sequence 1. The contact or attack area, for example, for moisture is significantly reduced on the outer surface 30 of the optoelectronic component 200, with the result that defects 40 in the encapsulation arrangement 4 need not lead as rapidly or preferably need not lead at all to a failure of the optoelectronic component 200.

Figure 3A:
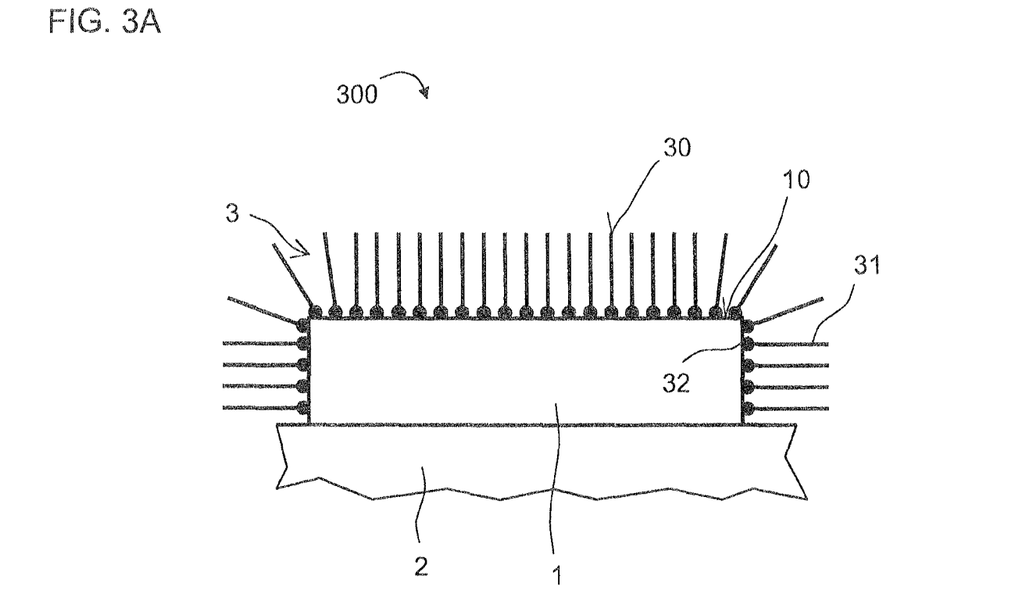
FIGS. 3A and 3B show schematic illustrations of an optoelectronic component in accordance with a further example.
Figure 3B:
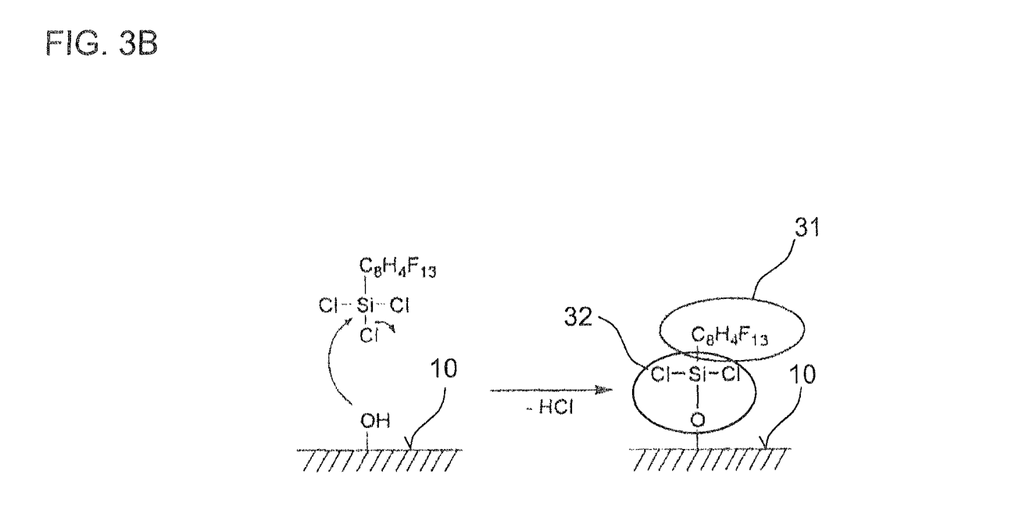

In the example in FIGS. 2A to 2C, the hydrophobic layer 3 can be, for example, a self assembled monolayer (SAM), as described in conjunction with FIGS. 3A and 3B. Alternatively, the hydrophobic layer 3 can also comprise a different material than the material shown in FIGS. 3A and 3B, for example, a superhydrophobic material, having a contact angle with water of greater than or equal to 160°.

In addition to the arrangement of the hydrophobic layer 3 on the encapsulation arrangement 4, the hydrophobic layer 3 can also partly or wholly cover the carrier 2.

A further example of an optoelectronic component 300 is shown in conjunction with FIGS. 3A and 3B. As shown in the examples in FIGS. 1 to 2C, the optoelectronic component 300 has a semiconductor layer sequence 1 on a carrier 2, which semiconductor layer sequence can be an organic or inorganic semiconductor layer sequence.

A self assembled monolayer is applied on the surface 10 of the semiconductor layer sequence 1 and forms the hydrophobic layer 3. The individual molecules of the hydrophobic layer 3 each have a hydrophobic group 31 facing away from the surface 10 and form the outer surface 30 of the optoelectronic component 300. Furthermore, the individual molecules of the hydrophobic layer 3 have a hydrophilic or polar group 32 via which the molecules of the hydrophobic layer 3 are covalently bonded to the surface 10 of the semiconductor layer sequence 1.

FIG. 3B schematically shows in this respect the step of applying a corresponding molecule to the surface 10. The molecules of the hydrophobic layer 3 are fluorinated organochlorosilanes which, by a dehydrochlorination reaction, form covalent bonds with hydroxy groups on the surface 10 of the semiconductor layer sequence 1. Instead of the $CF_3(CF_2)_5(CH_2)_2SiCl_3$ molecule shown in FIG. 3B, the hydrophobic layer 3 can also comprise other materials, as explained above.

Figure 4A:
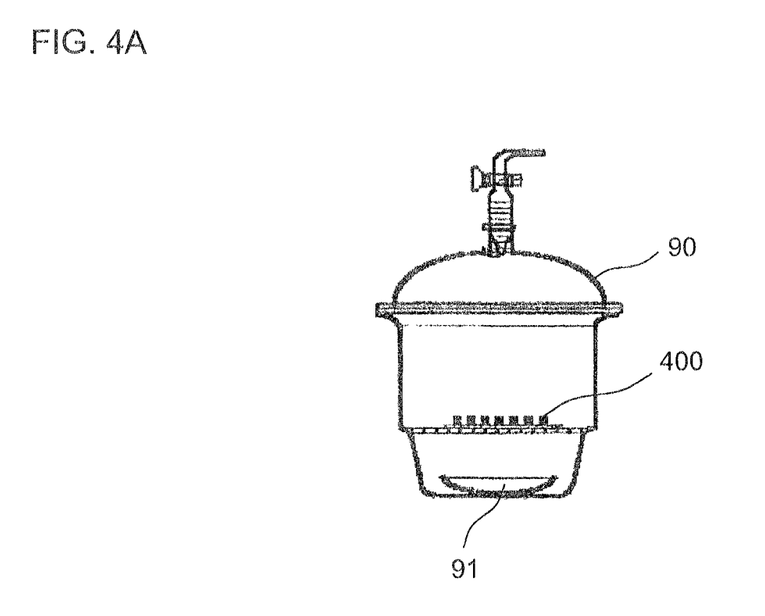
FIGS. 4A and 4B show devices for producing optoelectronic components in accordance with further examples.

To produce the hydrophobic layer 3 as shown in FIGS. 3A and 3B, one or, as shown in FIG. 4A, a plurality of optoelectronic components 400 can be arranged in a desiccator 90 with a suitable organosilane 91, for example, a fluorinated organochlorosilane, in a nitrogen gas atmosphere. The surfaces of the optoelectronic components 400 are then covered with the hydrophobic layer by a gas phase reaction.

Figure 4B:
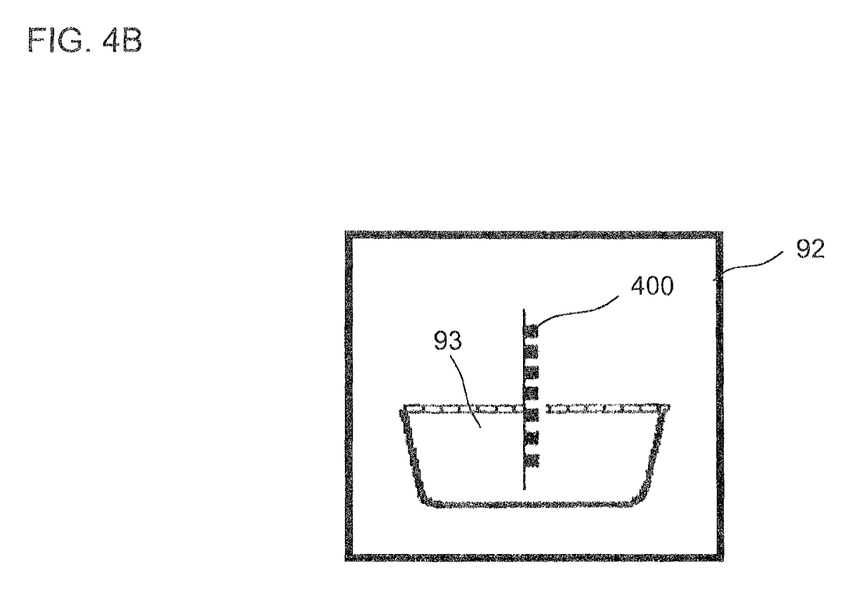

As is shown in FIG. 4B, it is also possible to dip the optoelectronic components 400 into a silane mixture 93 in a reaction chamber 92. By way of example, for this purpose, a mixture of a fluorinated organochlorosilane, for example, diluted in $CHCl_3$(abs.) dissolved in hexamethyldisiloxane (abs.), can react at room temperature for two hours under a nitrogen gas atmosphere.

It was established in measurements that a test surface composed of a gold-tin alloy which was coated with an organosilane by the method shown in FIG. 4A had a contact angle with water of approximately 112°, while the untreated surface had a contact angle of 31°. In comparison therewith, a hexamethyldisiloxane layer (HMDS) which was applied by a lithographic process still has a contact angle of approximately 56°.

The contact angle with moisture and thus the wettability of the outer surface of the optoelectronic components can thus be considerably reduced by the hydrophobic layer 3 described here.

Figure 5:
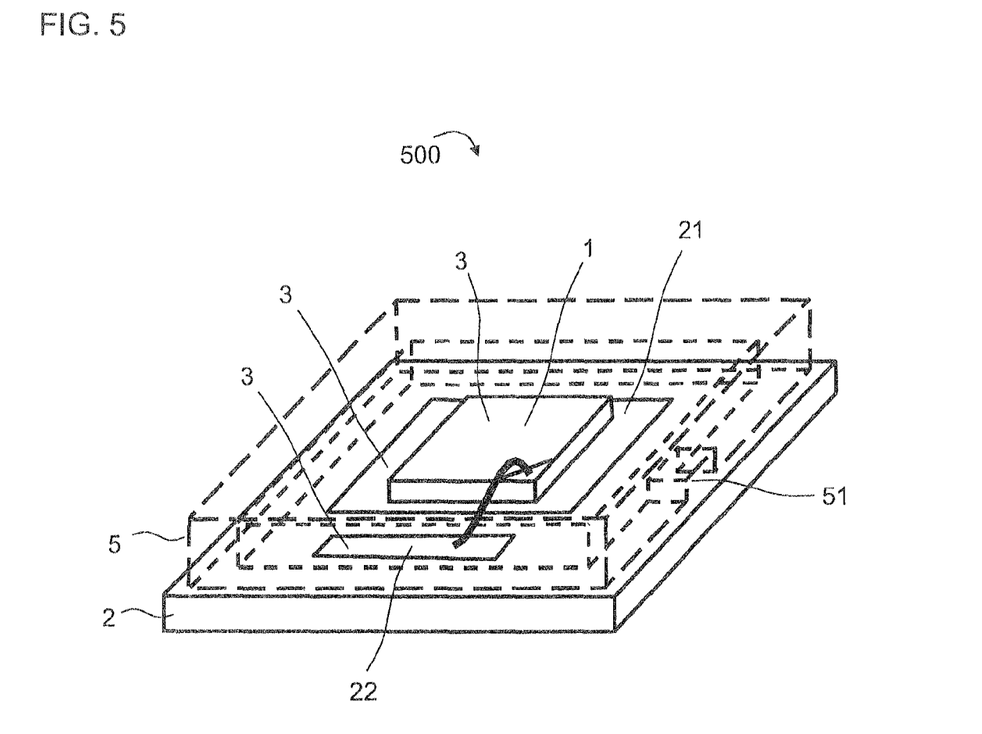
FIG. 5 shows a schematic illustration of an optoelectronic component in accordance with a further example.

FIG. 5 shows a further example of an optoelectronic component 500 such as is used, for example, in automotive applications. The optoelectronic component 500 has a carrier 2 which is a ceramic or plastic carrier, for example, and has contact areas 21 and 22 via which a semiconductor layer sequence 1 embodied as an inorganic semiconductor chip is electrically connected. For good electrical contacts, in particular silver alloys or silver are suitable for the electrical contact regions 21 and 22.

The optoelectronic component 500 is a semihermetically closed package that excludes a microclimate and for this purpose has a cover 5, which together with the carrier 2, forms a cavity in which the semiconductor layer sequence 1 is arranged and connects to the environment by a channel 51. The cover 5 is, for example, a glass cover having the channel 51 which is a ventilation slot. As a result, moisture and corrosive gases can penetrate as far as the contact regions 21, 22 and as far as the semiconductor layer sequence 1.

To protect the semiconductor layer sequence 1 and the contact regions 21 and 22 against moisture and corrosive gases such as hydrogen sulphide, for example, their surfaces are covered with a hydrophobic layer 3 which can comprise a material as described in conjunction with the preceding examples or as generally described.

Furthermore, it is also possible to cover, for example, only the contact regions 21, 22 or only the semiconductor layer sequence 1 at least partly with the hydrophobic layer 3. The hydrophobic layer 3 can increase the durability of the optoelectronic component 500 since ageing effects as a result of moisture or corrosive gases are reduced without the optoelectronic component 500 having to be a hermetically impermeably sealed package.

The examples shown in FIGS. 1 to 5 can alternatively or additionally have further or alternative features in accordance with the general description.

Our optoelectronic components are not restricted to the examples by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic component having an outer surface facing an environment of the optoelectronic component and the outer surface is formed by a hydrophobic layer applied at least partly on a surface of a thin film encapsulation layer of the optoelectronic component, wherein
hydrophobic material of the hydrophobic layer forms the outermost surface of the optoelectronic component, the hydrophobic material of the hydrophobic layer comprises at least partly perfluorinated carbon atoms,
the outermost surface and the hydrophobic material of the hydrophobic layer contact the environment, and the hydrophobic layer comprises a self-assembled monomolecular layer comprising hydrophobic functional groups facing away from the outermost surface of the optoelectronic component and being in contact with the environment which includes gases and/or liquids, and
individual molecules of the hydrophobic layer have a hydrophilic or polar group via which the individual molecules of the hydrophobic layer are covalently bonded to the surface of thin film encapsulation layer of the optoelectronic component.

2. The component according to claim 1, wherein the hydrophobic functional groups comprise fluorinated hydrocarbons.

3. The component according to claim 1, wherein the hydrophobic layer comprises a fluorinated organochlorosilane.

4. The component according to claim 1, wherein the hydrophobic layer is covalently bonded to the surface of the optoelectronic component.

5. The component according to claim 1, wherein the hydrophobic layer comprises a superhydrophobic material.

6. The component according to claim 1, wherein the optoelectronic component has an inorganic semiconductor layer sequence having an active region which emits light and/or detects light during operation.

7. The component according to claim 1, further comprising an organic semiconductor layer sequence having an active region which emits light and/or detects light during operation.

8. The component according to claim 6, wherein the surface covered at least partly with the hydrophobic layer is formed by a surface of the semiconductor layer sequence.

9. The component according to claim 6, further comprising an encapsulation arrangement on the semiconductor layer sequence and having at least one or a plurality of barrier layers each comprising an oxide, a nitride and/or an oxynitride.

10. The component according to claim 9, wherein the surface covered at least partly with the hydrophobic layer is formed by a surface of the encapsulation arrangement.

11. The component according to claim 6, wherein the semiconductor layer sequence is arranged on a carrier and the surface covered at least partly with the hydrophobic layer is a surface of the carrier.

12. The component according to claim 11, wherein the carrier has an electrical contact region having a metal layer and the surface covered at least partly with the hydrophobic layer is formed at least partly by the contact region.

13. The component according to claim 6, further comprising a cover, having a cavity open to the environment of the optoelectronic component, the semiconductor layer sequence and the hydrophobic layer being arranged in said cavity.

14. An optoelectronic component having an outer surface facing an environment of the optoelectronic component and the outer surface is formed by a hydrophobic layer applied at least partly on a surface of a thin film encapsulation layer of the optoelectronic component, wherein
hydrophobic material of the hydrophobic layer comprises at least partly perfluorinated carbon atoms, and the hydrophobic layer comprises a self-assembled monomolecular layer comprising hydrophobic functional groups facing away from the outermost surface of the optoelectronic component and being in contact with the environment which includes gases and/or liquids, and
individual molecules of the hydrophobic layer have a hydrophilic or polar group via which the individual molecules of the hydrophobic layer are covalently bonded to the surface of thin film encapsulation layer of the optoelectronic component.

15. The component according to claim 14, wherein the optoelectronic component has an inorganic semiconductor layer sequence having an active region which emits light and/or detects light during operation, and a surface to which the hydrophobic layer is covalently bonded is formed by a surface of the semiconductor layer sequence.

16. The component according to claim 14, further comprising an inorganic semiconductor layer sequence having an active region which emits light and/or detects light during operation, an encapsulation arrangement on the semiconductor layer sequence which has at least one or a plurality of barrier layers each comprising an oxide, a nitride and/or an oxynitride, and wherein the surface to which the hydrophobic layer is covalently bonded is formed by a surface of an encapsulation arrangement.

17. An optoelectronic component having an outer surface facing an environment of the optoelectronic component and the outer surface is formed by a hydrophobic layer applied at least partly on a surface of a thin film encapsulation layer of the optoelectronic component, wherein the hydrophobic layer comprises a self-assembled monomolecular layer comprising hydrophobic functional groups facing away from the outermost surface of the optoelectronic component and hydrophobic material of the hydrophobic layer forms the outermost surface of the optoelectronic component, wherein hydrophobic functional groups of the hydrophobic material comprise fluorinated hydrocarbons, the outermost surface and the hydrophobic material of the hydrophobic layer contact the environment which includes gases and/or liquids, and individual molecules of the hydrophobic layer have a hydrophilic or polar group via which the individual molecules of the hydrophobic layer are covalently bonded to the surface of thin film encapsulation layer of the optoelectronic component.

* * * * *